United States Patent
Cheung et al.

(10) Patent No.: US 7,034,588 B2
(45) Date of Patent: Apr. 25, 2006

(54) CALIBRATION OF UP AND DOWN CHARGE-PUMP CURRENTS USING A SAMPLE-AND-HOLD CIRCUIT DURING IDLE TIMES

(75) Inventors: Vincent Sin-Luen Cheung, Hong Kong (CN); Gary Wing-Kei Wong, Hong Kong (CN)

(73) Assignee: Pericom Technology Inc., San Jose, CA (US)

( * ) Notice: Subject to any disclaimer, the term of this patent is extended or adjusted under 35 U.S.C. 154(b) by 35 days.

(21) Appl. No.: 10/711,151

(22) Filed: Aug. 27, 2004

(65) Prior Publication Data

US 2006/0044031 A1 Mar. 2, 2006

(51) Int. Cl.
*H03L 7/06* (2006.01)
(52) U.S. Cl. .................................................... 327/157
(58) Field of Classification Search ........ 327/147–148, 327/156–157; 375/374
See application file for complete search history.

(56) References Cited

U.S. PATENT DOCUMENTS

| | | | |
|---|---|---|---|
| 5,508,660 A | 4/1996 | Gersbach et al. | 331/17 |
| 5,646,563 A | 7/1997 | Kuo | 327/157 |
| 6,265,946 B1 | 7/2001 | Bartlett | 331/17 |
| 6,292,061 B1* | 9/2001 | Qu | 331/17 |
| 6,597,217 B1* | 7/2003 | Ingino, Jr. | 327/157 |
| 6,608,511 B1 | 8/2003 | Hsu | 327/157 |
| 6,611,160 B1* | 8/2003 | Lee et al. | 327/157 |
| 6,636,105 B1* | 10/2003 | Soda | 327/537 |
| 6,664,828 B1 | 12/2003 | Gauthier et al. | 327/157 |

* cited by examiner

*Primary Examiner*—My-Trang Nu Ton
(74) *Attorney, Agent, or Firm*—Stuart T. Auvinen

(57) ABSTRACT

A charge pump for a phase-locked loop (PLL) has accurate matching of charge and discharge currents applied to the PLL's loop filter. A variable current-sink transistor has its gate-to-source voltage adjusted to match a source current from a fixed current source. An intermediate node in-between series transistors between the current source and sink is sampled by a sampling transistor that connects the intermediate node to a sampling capacitor. The sampling capacitor's voltage is the gate-to-source voltage of the variable current-sink transistor. The variable current-sink transistor has its gate and drain coupled together through the sampling transistor during calibration periods when the charge pump is otherwise idle. When the source current exactly matches the sink current, the gate-to-source voltage stored on the sampling capacitor reaches steady state. Up and down currents are balanced in driver transistors that match the series transistors.

20 Claims, 4 Drawing Sheets

CALIBRATION OF UP AND DOWN CHARGE-PUMP CURRENTS USING A SAMPLE-AND-HOLD CIRCUIT DURING IDLE TIMES

This invention relates to phase-locked loop (PLL) charge pumps, and more particularly to sample-and-hold charge pumps.

Digital systems often rely on accurate clocks that synchronize the timing of operations and data transfers. A crystal oscillator is often used to generate a clock at a base frequency, which is then divided or multiplied to create one or more clocks with desired frequencies. External clocks can be received and likewise divided or multiplied to produce internal clocks. Clocks are typically generated from oscillator outputs using phase-locked loops (PLL's). PLLs are one of the most widely use building blocks in digital systems today.

FIG. 1 illustrates a typical PLL. Phase detector 10 receives a reference-clock input from an external oscillator or clock source. The phase and frequency of the reference clock is compared to the phase and frequency of a feedback clock generated by voltage-controlled oscillator (VCO) 14. The feedback clock can be the output clock generated by the PLL, or a divided-down derivative of the output clock from VCO 14.

Phase detector 10 outputs up and down signals UP, DN when the phase or frequency of one input does not match the phase or frequency of the other input. These up and down signals cause charge pump 12 to add or remove charge from filter capacitor 20, which integrates the charge. As charge is added or removed from filter capacitor 20, the voltage input to VCO 14 is increased or decreased. VCO 14 responds by increasing or decreasing the frequency of the output clock. The feedback clock to phase detector 10 is likewise changed by VCO 14.

As charge pump 12 adds or removes charge from filter capacitor 20, altering control voltage VCTL input to VCO 14, the phase and frequency of the feedback clock are adjusted until the reference clock is matched. Then phase detector 10 stops generating up and down signals to charge pump 12, until charge leaks off filter capacitor 20 or the reference clock changes.

Pulses of short duration are often used for up and down signals UP, DN. For example, phase detector 10 can be a pair of simple flip-flops. One flip-flop outputs the UP pulse when clocked by the reference-clock input. The UP pulse ends when cleared by the feedback-clock input. The other flip-flop generates the DN pulse when clocked by the feedback-clock input. The DN pulse ends when cleared by the reference-clock input. As the phases match more closely, the duration of the pulses shorten.

Often both up and down signals are pulsed simultaneously when no phase adjustment is needed. Charge pump 12 should supply either no charge or equal up and down charges to filter capacitor 20 so that a net zero charge is supplied when the duration of simultaneous UP and DN pulses are identical.

Since clocks are intended to be stable, most of the time charge pump 12 is outputting a net zero charge to filter capacitor 20. If the UP and DN sections of charge pump 12 are not matched exactly, some net charge may be applied to filter capacitor 20. This net charge results in a phase error, since VCO 14 responds by slightly changing the phase and frequency of the feedback clock so that it no longer exactly matches the reference clock. The feedback clock from VCO 14 eventually matches with the reference clock with a phase error proportional to the error net charge from charge pump due to up/down current mismatch.

FIG. 2 is a timing diagram of UP and DOWN inputs to a charge pump and the resulting control voltage to the VCO. When a leading phase difference is detected by the phase detector, an UP pulse is generated. The charge pump responds to the UP pulse by pumping positive charge to the filter capacitor, increasing the control voltage VCTL to the VCO (assuming the VCO output frequency is proportional to the control voltage). The amount of charge pumped to the filter capacitor depends on the duration of the UP pulse. Once the UP pulse ends, the control voltage remains stable.

When a lagging phase difference is detected by the phase detector, a DN pulse is generated. The charge pump responds to the DN pulse by sinking charge from the filter capacitor, decreasing the control voltage VCTL to the VCO. The amount of charge pumped from the filter capacitor depends on the duration of the DN pulse. Once the DN pulse ends, the control voltage remains stable.

Finally, as FIG. 2 shows, the phases are matched and the phase detector outputs both UP and DN pulses simultaneously. The control voltage should not change, but the charge pump is not perfect and causes some noise on the control voltage as transistors in the charge pump are switched on and off by the UP and DN pulses. Should the UP and DN pump transistors not match, a net charge can be added to the control voltage as shown. This net charge is an error caused by the charge pump that reduces the accuracy of the PLL.

Charge pumps are often constructed using complementary metal-oxide-semiconductor (CMOS) transistors. CMOS charge pumps often have errors because the p-channel and n-channel transistors are not exactly matched. The p-channel transistors are typically wider than the n-channel to account for the higher electron mobility than the hole mobility. The wider transistor has higher parasitic capacitances, which result in more charge injection during switching than the n-channel transistors.

Compounding the problem is that p- and n-channel devices differ in their response to variations in process, voltage, and temperature. This p/n mismatch is particularly severe when the transistor drains are connected to the control voltage and the gates are switched on and off by the UP, DN pulses. Thus standard CMOS push-pull logic arrangements yields poor charge matching.

An example of a source-follower charge pump is disclosed in U.S. Pat. No. 5,508,660 assigned to IBM. This uses a NMOS transistor to drive the control voltage high and a PMOS transistor to drive the control voltage low. This design might suffer from phase error, noise, and process, voltage, temperature tracking problems.

FIG. 3 shows a prior-art source-switched charge pump. P- and n-channel drive transistors 24, 26 are common-gate transistors biased on by constant bias voltages BIASP, BIASN respectively. Transistors 24, 26 are switched on and off by raising and lowering their source voltages, and are thus controlled by their sources, or source-switched.

When the down pulse DN is pulsed high, n-channel transistor 28 turns on. This charges the source of n-channel drive transistor 26, lowering its source voltage until the gate-to-source voltage exceeds the n-channel threshold. Current then flows from the up filter capacitor 20, through n-channel transistors 26, 28, to ground to discharge filter capacitor 20, decreasing the control voltage VCTL.

When the up pulse UP is received, its inverse UPB is pulsed low, turning on p-channel transistor 22. This charges the source of p-channel drive transistor 24, raising its voltage until the gate-to-source voltage difference exceeds the p-channel threshold. Current then flows from the power supply, through p-channel transistors 22, 24 to charge up filter capacitor 20, increasing the control voltage VCTL.

The supply transistors 22, 28 are actively switched on and off by the UPB and DN pulses, switching the source voltages of drive transistors 24, 26 to turn these transistors on and off. See for example U.S. Pat. No. 5,646,563 by Kuo, assigned to National Semiconductor Corp. of Santa Clara Calif.

When supply transistors 22, 28 are switched off, the source nodes of drive transistors 24, 26 are left floating. This is undesirable since the turn off time depends on a slow decaying gm/C response, allowing additional charge to be taken from the filter capacitor. This may result in a significant phase error. More seriously, the currents generated by supply transistors 22, 28 are dependent on the device aspect ratio and gate-to-source voltage. Thus the charge-pump up/down currents are very sensitive to process, temperature and supply-voltages variations.

The charge transferred to the filter capacitor may depend not just on the gate voltages of drive transistors 24, 26, BIASP and BIASN, but also on the drain-source voltages. The gate voltages BIASP and BIASN are independent of the drain-source voltages of drive transistors 24, 26. This results in further mismatch and phase error.

The up and down pulses that control the prior-art charge pump of FIG. 3 have opposite polarity. A low-going UPB pulse is used with a high-going DN pulse. Further mismatch can occur since the UPB and DN logic from the phase detector may not be exactly matched in delay. When the phase detector outputs only positive-logic pulses, an extra delay occurs in the charge pump to invert UP to UPB. The pulse widths and rise and fall times are often altered by the extra inversion as well. The extra delay and skews may cause phase error for simultaneous UP and DN pulses.

What is desired is a more accurate CMOS charge pump. It is desired to further reduce phase error in the charge pump. It is desired to reduce phase error using a sample-and-hold circuit for biasing the charge pump. A charge pump with closely matched charge and discharge currents is desired.

DETAILED DESCRIPTION

The present invention relates to an improvement in charge pumps. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that sample-and-hold techniques can be applied to better match charge-pump currents. A charge pump can have a current source and a current sink. Current from the current source is forced through a current-sink transistor. When the current-sink transistor has its gate and drain connected together, it operates in saturation and has a current proportional to the square of its gate-to-source voltage over its threshold voltage. The gate-to-source voltage is adjusted to sink the same current as generated by the current source.

A sampling capacitor stores the gate-to-source voltage. The sampling capacitor is charged when the gate and drain of the current-sink transistor are connected together during calibration periods. During other periods of time, the connection between the gate and drain is broken. The stored gate-to-source voltage on the sampling capacitor drives the current-sink transistor to sink the same current as during the calibration period. During the next calibration period, the source current is again sampled, and the gate-to-source voltage and current sink again adjusted. The voltage on the sampling capacitor converges toward a target value that has matched up and down currents delivered to the loop filter.

Calibration and sampling can be performed during times that the charge pump is idle. Often charge pumps may be pulsed on and off in response to a phase detector. Idle times between pulses can be used to sample the source current and adjust the sink current.

Figure 1:
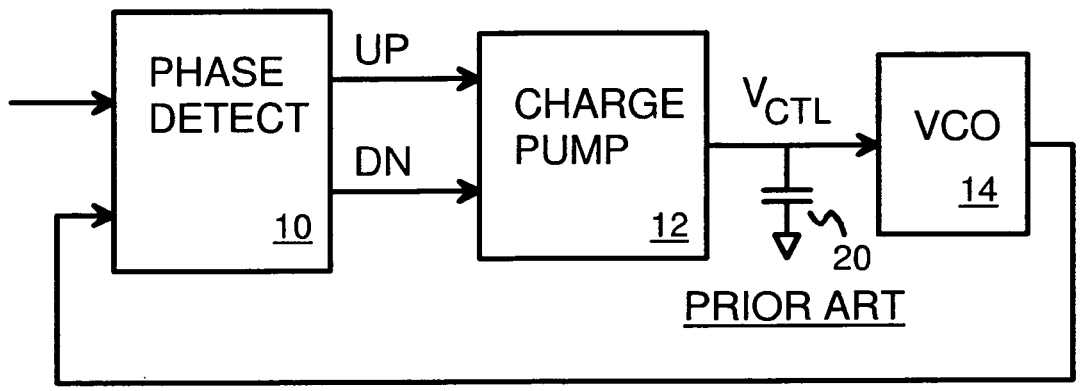
FIG. 1 illustrates a typical PLL.
Figure 2:
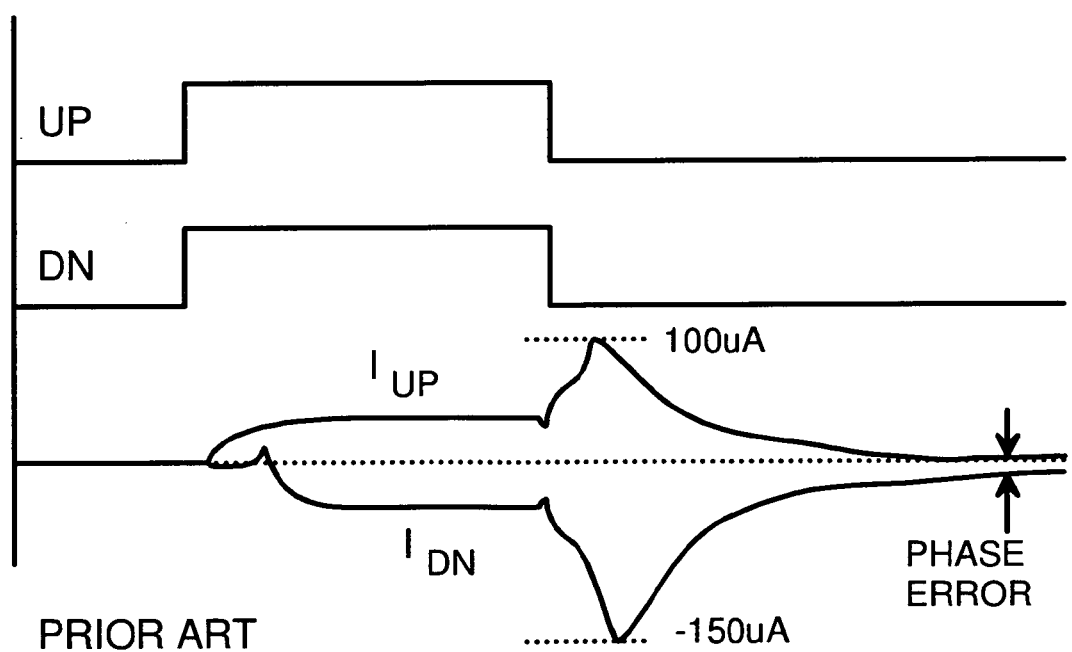
FIG. 2 is a timing diagram of UP and DOWN inputs to a charge pump and the resulting control voltage to the VCO.
Figure 3:
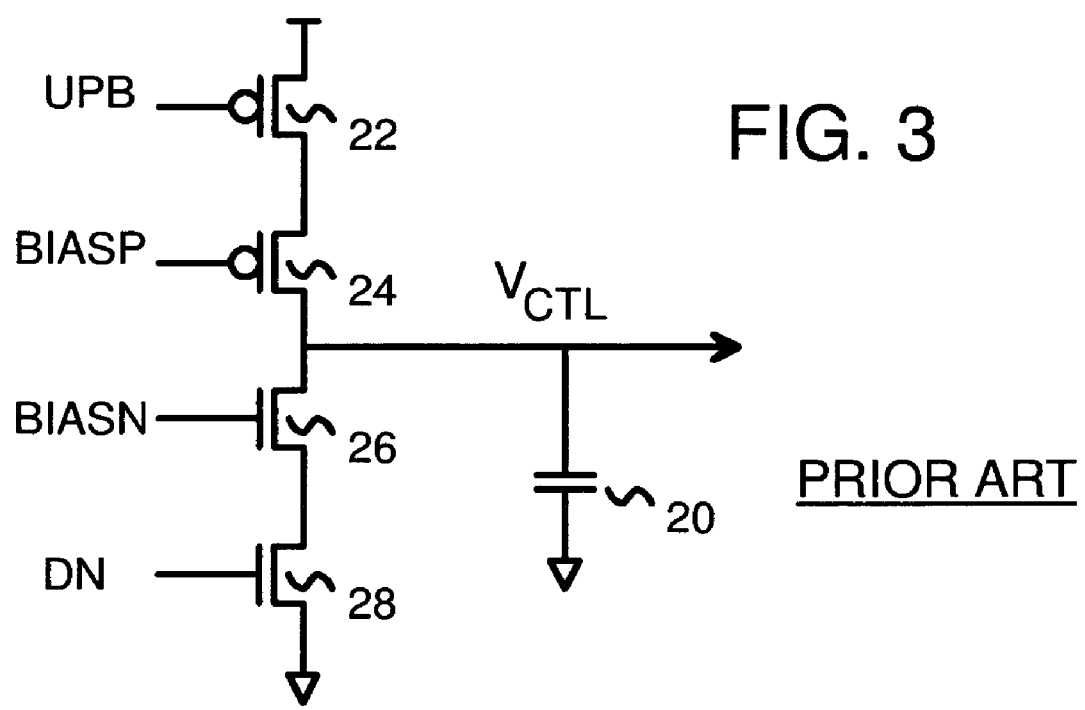
FIG. 3 shows a prior-art source-switched charge pump.
Figure 4:
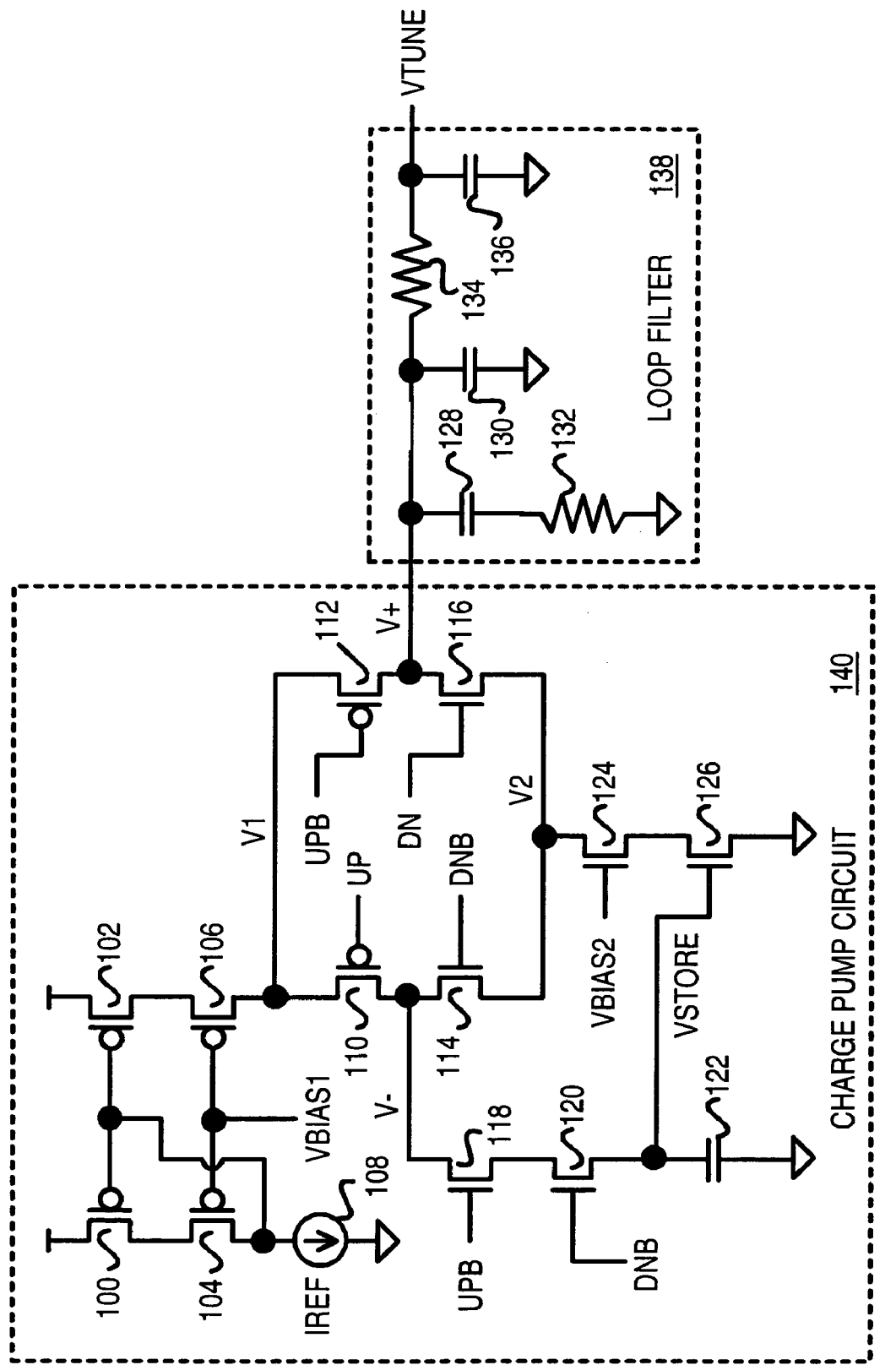
FIG. 4 is a diagram of a charge pump with a sample-and-hold circuit for matching currents.

FIG. 4 is a diagram of a charge pump with a sample-and-hold circuit for matching currents. Charge pump 140 receives control signals UP, UPB, DN, DNB from a phase detector that compares a reference clock to a feedback clock in a PLL or similar device, such as a frequency synthesizer, a delay-locked loop, and spread-spectrum clock generators that modulate the charge-pump current. The output of charge pump 140, signal V+, drives loop filter 138. Loop filter 138 includes capacitors 130, 136 separate by series resistor 134, and capacitor 128 and resistor 132 to ground from V+. The output of loop filter 138, VTUNE, is the voltage sensed by a VCO that sets the output and feedback frequency. Other loop filters could be substituted, such as a single capacitor to ground with VTUNE and V+ being the same node.

The phase detector pulses UP high and UPB low to charge loop filter 138, to increase the voltage on VTUNE and thus speed up the VCO. The phase detector pulses DN high and DNB low to discharge loop filter 138, to drop the voltage on VTUNE and slow the VCO frequency. During idle times, such as between edges of the reference clock, UP, DN are low and UPB, DNB are high. During these idle times calibration is performed, by sampling the source current by connecting the intermediate node to the sampling capacitor 122, and by storing the gate voltage needed to match the sink current to the source current. The voltage on sampling capacitor 122 is VSTORE, which is fed back to the gate of n-channel sink transistor 126 to adjust the current sunk to ground.

A current source is provided by p-channel transistors 102, 106 in series between power and node V1. A current sink is provided by n-channel transistors 124, 126, which are in series with each other between node V2 and ground.

A reference current is generated by current reference 108 to ground, which pulls current through p-channel transistors 100, 104 which are in series to power. The drain of p-channel transistor 104 is the upper gate voltage applied to p-channel transistors 100, 102, while a bias voltage VBIAS1 is applied to the gates of p-channel transistors 104, 106. The current sourced through transistors 102, 106 is thus relatively constant and not dependent on the output voltage V+.

Current-sink n-channel transistor 124 receives bias voltage VBIAS2 on its gate. Sampled voltage VSTORE is applied to the gate of n-channel transistor 126, which acts as an adjustable current sink. The current sunk from node V2 is thus dependent on the sampled voltage VSTORE. This voltage is adjusted during calibration to better match the current sourced through p-channel transistors 102, 106.

Current is switched between nodes V1 and V2 by p-channel transistors 110, 112 and n-channel transistors 114, 116. Output node V+ is driven high by a charging current through p-channel transistor 112 when UPB pulses low, and is driven lower by a discharging current through n-channel transistor 116 when DN pulses high.

When UP is low, current from current-source transistors 102, 106 is diverted through p-channel transistor 110 to intermediate node V−. When DNB is high, current flows through n-channel transistor 114.

Both UP is low and DNB is high during idle times, when calibration is performed. During these idle times, transistors 112, 116 are off and transistors 110, 114 are on. Current flows from the current source of p-channel transistors 102, 106 to node V1, then through idle transistors 110, 114 to node V2, then through the current sink of n-channel transistors 124, 126. The gate voltage VSTORE stored by sampling capacitor 122 adjusts the down current through transistor 126.

Sensing transistors 118, 120 function as switches in the circuit. When sensing transistors 118, 120 are turned on, they connect n-channel transistor 126 in a diode-connected mode, since the gate VSTORE and drain of n-channel transistor 126 are coupled together through transistors 118, 120, 114, 124. N-channel transistor 126 then samples the current supplied by p-channel transistor 106, which can act as an ideal current source. The sampled voltage VSTORE to sampling capacitor 122 corresponds to the gate-to-source voltage needed for n-channel transistor 126 to sink the sampled source current. Current flow through a CMOS transistor operated in saturation region is governed by its gate-to-source (VGS) and device aspect ratio. By storing the gate-to-source voltage of a transistor, the transistor supplies the sampled current.

The current from p-channel transistor 106 through intermediate node V− is sampled during idle times when current flow through idle transistors 110, 114 passes through intermediate node V−. Sensing transistors 118, 120 both turn on during idle times, allowing the current at node V− to be sampled, as transistors 118, 120 connect V− to sampling capacitor 122. Sampling capacitor 122 is charged when intermediate voltage V− is above VSTORE, but is discharged when intermediate voltage V− is below VSTORE.

The gate of n-channel sensing transistor 118 is UPB, which is high during idle times, while the gate of n-channel sensing transistor 120 is DNB, which is also high during idle times. During these idle times, the upper node of sampling capacitor 122, VSTORE, is driven so that the sink current trough transistor 126 matches the source current into intermediate node V−. When the sink current is less than the source current, V− is above VSTORE, sampling capacitor 122 is charged and VSTORE is raised, increasing the current sunk through transistor 126, which ultimately lowers intermediate voltage V−. When the sink current is greater than the source current, V− drops below VSTORE, sampling capacitor 122 is discharged and VSTORE is lowered, decreasing the current sunk through transistor 126, which ultimately allows intermediate voltage V− to rise. Thus the voltage of sampling capacitor 122, VSTORE, is driven to match currents by the feedback loop.

Figure 5:
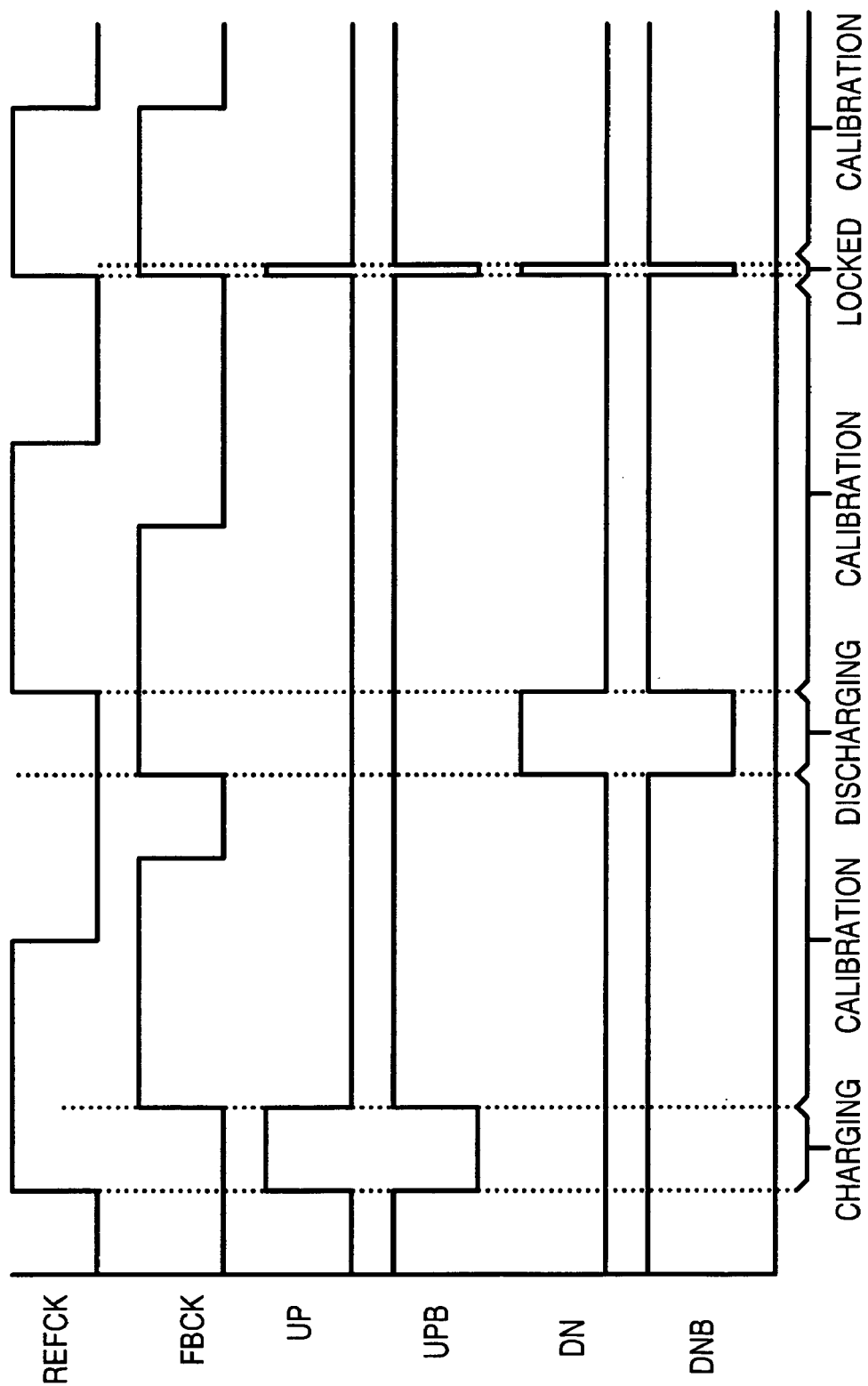
FIG. 5 is a waveform diagram showing operation of the sample-and-hold charge pump.

FIG. 5 is a waveform diagram showing operation of the sample-and-hold charge pump. A reference clock REFCK is compared to a feedback clock FBCK by a phase comparator. When the feedback clock is too slow, the rising edge of FBCK lags the rising edge of REFCK. UP is pulsed high and UPB is pulsed low. This causes the charge pump to charge the loop filter, raising VTUNE and increasing the VCO frequency, speeding up the feedback clock. This is a CHARGING period.

When the feedback clock is too fast, the rising edge of FBCK precedes the rising edge of REFCK. DN is pulsed high and DNB is pulsed low. This causes the charge pump to discharge the loop filter, lowering VTUNE and decreasing the VCO frequency, slowing the feedback clock. This is a DISCHARGING period.

When the rising edges of FBCK and REFCK are close together, both UP and DN can be pulsed high. This is a LOCKED period. The charging and discharging currents cancel out since they are calibrated to match.

When neither UP nor DN is pulsed high, an idle period occurs. These idle periods occur between rising edges of the reference clock and can be used for calibration.

During CALIBRATION periods, sensing transistors 118, 120 both turn on, coupling intermediate node V− to sampling capacitor 122. This causes transistor 126 to have its gate and drain coupled together through other transistors. The stored voltage VSTORE is adjusted to adjust the gate-to-source voltage of transistor 126 to better match currents. Once either UPB or DNB falls, sampling ends and the charge remains on sampling capacitor 122. Thus sampling of the current supplied by p-channel transistor 102 during idle times allows for adjustment of the current sink and convergence of VSTORE to the gate-to-source voltage needed to match currents.

The length of time that the UP or DN pulse is generated for can vary from that shown in the waveform and does not have to be the same as the leading or lagging period, but could be a fixed amount of time. The pulse width could also be proportional to the lead or lag time. Calibration could be performed less frequently, such as after every other rising edge of REFCLK, or after a timer or counter reaches a predetermined count. This could be a programmable option as well.

ALTERNATE EMBODIMENTS

Several other embodiments are contemplated by the inventors. For example p and n-channel devices can be swapped with UP/DOWN calibration control modified accordingly. Capacitors can have their second plates connect to the power supply or to a middle voltage or to some other voltage. Capacitors could be parasitic capacitors of the sink transistor itself. Positive rather than negative up and down pulses can be used as inputs. Inversions of signals can be included. Device sizes can vary, and newer processes and circuits can be employed with the invention. Devices other than MOS transistors can be used. Additional devices such as transistors, capacitors, or resistors can be added. For example, a series resistor could be added near sampling capacitor 122 to change the R-C time constant and response time of the feedback path.

Various filters may be used with the charge pump. A simple capacitor may be substituted for the filter, or more complex filters. The loop filter shown is just one of many possible filters that drive the VCO input.

All modes of charge-pump operation may not be supported in all embodiments. Rather than have both an idle and a locked mode, only the idle or only the locked mode could be used. Rather than use two transistors in series to sample the reference current from p-channel transistor 106, one transistor or a transmission gate could be used. A gate control signal could be generated from an AND gate or, using DeMorgan's theorem, a NOR gate with UPB, DNB as inputs.

Cascode (series) connection of transistors helps to minimize the channel-length modulation effect and helps to maintain constant currents even when output voltages change somewhat. Cascode transistors can be operated in saturation by may operate in the linear region for short period of time. Rather than use Cascode transistors, single transistors could be used. Other techniques could be used to minimize the channel-length modulation effect. Current can be considered to flow in either direction, so source and sink terminology can thus be reversed.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A charge pump comprising:
   an up input and a down input to the charge pump;
   an output having an output capacitance to be charged in response to the up input and discharged in response to the down input;
   a fixed current source that sources a relatively constant source current to a first junction node;
   a variable current source that sources a varying source current to a second junction node, wherein the varying source current varies in response to a control voltage;
   a first driver transistor, coupled to conduct current between the first junction node and the output in response to the up input;
   a second driver transistor, coupled to conduct current between the second junction node and the output in response to the down input;
   a first series transistor, coupled to conduct current between the first junction node and an intermediate node in response to the up input being inactive;
   a second series transistor, coupled to conduct current between the second junction node and the intermediate node in response to the down input being inactive;
   a sampling capacitor for storing a sampled charge, generating the control voltage to the variable current source; and
   a sampling switch coupled to conduct current between the intermediate node and the sampling capacitor when the up input and the down input are inactive, whereby the intermediate node is coupled to the sampling capacitor to adjust the varying source current.

2. The charge pump of claim 1 wherein the sampling switch comprises a sampling transistor and a logic gate;
   wherein the sampling transistor receives a logic output signal on a gate;
   wherein the logic gate receives the up input and the down input or an inverse of the up input and an inverse of the down input and generates the logic output signal.

3. The charge pump of claim 1 wherein the sampling switch comprises a first sampling transistor and a second sampling transistor in series between the intermediate node and a control node of the sampling capacitor;
   wherein the first sampling transistor receives an inverse of the up input on a gate;
   wherein the second sampling transistor receives an inverse of the down input on a gate.

4. The charge pump of claim 3 wherein the first sampling transistor is an n-channel transistor;
   wherein the second sampling transistor is an n-channel transistor.

5. The charge pump of claim 4 wherein the first driver transistor is a p-channel transistor;
   wherein the first series transistor is a p-channel transistor;
   wherein the second driver transistor is an n-channel transistor; and
   wherein the second series transistor is an n-channel transistor.

6. The charge pump of claim 5 wherein the up input is pulsed low to charge the output capacitance;
   wherein the down input is pulsed high to discharge the output capacitance.

7. The charge pump of claim 6 further comprising:
   a loop filter that includes the output capacitance charged and discharged by the charge pump;
   a phase comparator, receiving a feedback clock and a reference clock, for generating the up input and the down input in response to phase comparisons;
   a voltage-controlled oscillator (VCO) sensing an output voltage on the output capacitance and generating the feedback clock with a frequency dependent on the output voltage.

8. The charge pump of claim 7 wherein the up input is high and the down input is low for idle periods of time between phase comparisons by the phase comparator in a phase-locked loop (PLL);
   wherein the intermediate node is sampled during the idle periods of time.

9. The charge pump of claim 8 wherein the up input is low and the down input is high simultaneously during a locked period when the PLL is stable and phase comparison of a feedback clock to the reference clock detects no phase difference;
   wherein both the first and second driver transistors are on during the locked period.

10. The charge pump of claim 3 wherein the variable current source comprises:
    a first sink transistor, receiving a first voltage bias on a gate;
    a second sink transistor, receiving the control voltage on a gate;

wherein the first sink transistor and the second sink transistor are in series between the second junction node and a ground.

11. The charge pump of claim 10 wherein the first and second sink transistors are n-channel transistors.

12. The charge pump of claim 11 wherein the fixed current source comprises:
a first source transistor, receiving a second bias voltage on a gate;
a second source transistor, receiving a third bias voltage on a gate;
wherein the first source transistor and the second source transistor are in series between the first junction node and a power supply.

13. The charge pump of claim 12 wherein the first and second source transistors are p-channel transistors.

14. The charge pump of claim 13 further comprising:
a bias generator for generating the second bias voltage, the bias generator comprising a first bias transistor, a second bias transistor, and a reference current source in series between the power supply and the ground;
wherein the first bias transistor has a gate receiving the second bias voltage;
wherein the second bias transistor has a gate receiving the third bias voltage;
wherein a node between the second bias transistor and the reference current source generates the second bias voltage.

15. The charge pump of claim 14 wherein the sampling capacitor is connected between the control node having the control voltage and the ground.

16. The charge pump of claim 15 wherein the first driver transistor and the first series transistor have a same gate size;
wherein the second driver transistor and the second series transistor have a same gate size,
whereby series transistors match driver transistors.

17. A current-adjusting charge pump comprising:
a current source, coupled between a power supply and an upper junction node;
a first driver transistor, having a gate driven by an inverse-charging signal, a source connected to the upper junction node, and a drain connected to an output;
a first series transistor, having a gate driven by a charging signal, a source connected to the upper junction node, and a drain connected to an intermediate node;
a second driver transistor, having a gate driven by a discharging signal, a source connected to a lower junction node, and a drain connected to the output;
a second series transistor, having a gate driven by an inverse-discharging signal, a source connected to the lower junction node, and a drain connected to the intermediate node;
a first switch transistor, having a gate driven by the inverse-charging signal, a drain connected to the intermediate node, and a source connected to a mid-switch node;
a second switch transistor, having a gate driven by the inverse-discharging signal, a drain connected to the mid-switch node, and a source connected to a charge-storage node;
a sampling capacitor coupled between the charge-storage node and a fixed voltage;
a fixed sink transistor having a gate driven by a bias voltage, a drain connected to the lower junction node, and a source connected to a mid-sink node; and
a variable sink transistor having a gate connected to the charge-storage node, a drain connected to the mid-sink node, and a source connected to a ground.

18. The current-adjusting charge pump of claim 17 wherein the first series transistor and the first driver transistor are p-channel transistors;
wherein the second series transistor, the second driver transistor, the first switch transistor, the second switch transistor, the fixed sink transistor, and the variable sink transistor are n-channel transistors.

19. An accurate charge pump with matched up and down currents for charging and discharging a filter capacitor on an output node, the accurate charge pump comprising:
an UP signal for charging the filter capacitor when pulsed high;
an UPB signal for charging the filter capacitor when pulsed low;
a DN signal for discharging the filter capacitor when pulsed high;
a DNB signal for discharging the filter capacitor when pulsed low;
fixed current source means for generating a fixed current to a first junction;
variable current source means for generating an adjustable current to a second junction in response to a control voltage on a control node;
first driver transistor means, responsive to the UPB signal on a gate, for conducting current from the first junction to the output node;
first series transistor means, responsive to the UP signal on a gate, for conducting current from the first junction to an intermediate node;
second driver transistor means, responsive to the DN signal on a gate, for conducting current from the second junction to the output node;
second series transistor means, responsive to the DNB signal on a gate, for conducting current from the second junction to the intermediate node;
sampling capacitor means for storing charge to generate the control voltage on the control node; and
sample switch means for conducting between the intermediate node and the control node when UPB and DNB signals are both high.

20. The accurate charge pump of claim 19 wherein the sample switch means comprises:
first switch transistor means, responsive to the UPB signal on a gate, for conducting current in a first channel;
second switch transistor means, responsive to the DNB signal on a gate, for conducting current in a second channel;
wherein the first channel and the second channel are in series between the intermediate node and the control node.

* * * * *